(12) United States Patent
Kinoshita et al.

(10) Patent No.: US 10,403,749 B2
(45) Date of Patent: Sep. 3, 2019

(54) METHOD OF MANUFACTURING SEMICONDUCTOR DEVICE

(71) Applicant: FUJI ELECTRIC CO., LTD., Kawasaki-shi, Kanagawa (JP)

(72) Inventors: Akimasa Kinoshita, Matsumoto (JP); Shinsuke Harada, Tsukuba (JP); Yasunori Tanaka, Tsukuba (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 16/263,643

(22) Filed: Jan. 31, 2019

(65) Prior Publication Data
US 2019/0165166 A1 May 30, 2019

Related U.S. Application Data

(60) Division of application No. 15/909,971, filed on Mar. 1, 2018, now Pat. No. 10,199,493, which is a (Continued)

(30) Foreign Application Priority Data

Oct. 16, 2015 (JP) ................................. 2015-204672

(51) Int. Cl.
*H01L 29/78* (2006.01)
*H01L 29/423* (2006.01)
(Continued)

(52) U.S. Cl.
CPC .... *H01L 29/7813* (2013.01); *H01L 21/02529* (2013.01); *H01L 21/049* (2013.01);
(Continued)

(58) Field of Classification Search
None
See application file for complete search history.

(56) References Cited

U.S. PATENT DOCUMENTS 6,180,958 B1  1/2001  Cooper, Jr.
10,199,493 B2 * 2/2019  Kinoshita ............... H01L 29/78
(Continued)

FOREIGN PATENT DOCUMENTS

JP  2001-267570 A  9/2001
JP  2009-260253 A  11/2009
(Continued)

*Primary Examiner* — Jack S Chen
(74) *Attorney, Agent, or Firm* — Rabin & Berdo, P.C.

(57) ABSTRACT

In a first main surface side of a silicon carbide semiconductor base, a trench is formed. A second base region of a second conductivity type is arranged at a position facing the trench in a depth direction. An end (toward a drain electrode) of the second base region of the second conductivity type, and an end (toward the drain electrode) of a first base region of the second conductivity type reach a position deeper than an end (toward the drain electrode) of a region of a first conductivity type. Thus, the electric field at a gate insulating film at the trench bottom is mitigated, suppressing the breakdown voltage of the active region and enabling breakdown voltage design of the edge termination region to be facilitated. Further, such a semiconductor device may be formed by an easy method of manufacturing.

6 Claims, 11 Drawing Sheets

Related U.S. Application Data continuation of application No. PCT/JP2016/076419, filed on Sep. 8, 2016.

(51) Int. Cl.

| | | |
|---|---|---|
| *H01L 29/417* | (2006.01) | |
| *H01L 29/36* | (2006.01) | |
| *H01L 29/10* | (2006.01) | |
| *H01L 29/08* | (2006.01) | |
| *H01L 29/06* | (2006.01) | |
| *H01L 21/04* | (2006.01) | |
| *H01L 29/66* | (2006.01) | |
| *H01L 29/12* | (2006.01) | |
| *H01L 21/02* | (2006.01) | |
| *H01L 29/16* | (2006.01) | |
| *H01L 29/45* | (2006.01) | |
| *H01L 21/027* | (2006.01) | |
| *H01L 29/167* | (2006.01) | |

(52) U.S. Cl.
CPC .......... *H01L 21/0475* (2013.01); *H01L 29/06* (2013.01); *H01L 29/0696* (2013.01); *H01L 29/086* (2013.01); *H01L 29/1095* (2013.01); *H01L 29/12* (2013.01); *H01L 29/1608* (2013.01); *H01L 29/36* (2013.01); *H01L 29/41741* (2013.01); *H01L 29/4236* (2013.01); *H01L 29/66068* (2013.01); *H01L 29/66734* (2013.01); *H01L 29/78* (2013.01); *H01L 21/0274* (2013.01); *H01L 21/02378* (2013.01); *H01L 21/02634* (2013.01); *H01L 21/0465* (2013.01); *H01L 21/0485* (2013.01); *H01L 29/167* (2013.01); *H01L 29/45* (2013.01)

(56) References Cited

U.S. PATENT DOCUMENTS

| | | |
|---|---|---|
| 2011/0024831 A1 | 2/2011 | Nakano |
| 2012/0037920 A1 | 2/2012 | Treu et al. |
| 2014/0175459 A1 | 6/2014 | Yamamoto et al. |
| 2014/0264564 A1 | 9/2014 | Cheng et al. |
| 2016/0247910 A1 | 8/2016 | Suzuki et al. |
| 2017/0133466 A1 | 5/2017 | Shiomi |
| 2017/0141186 A1 | 5/2017 | Shiomi |
| 2018/0197983 A1 | 7/2018 | Kinoshita et al. |

FOREIGN PATENT DOCUMENTS

| | | |
|---|---|---|
| JP | 2012-169384 A | 9/2012 |
| JP | 2012-169385 A | 9/2012 |
| JP | 5539931 B2 | 7/2014 |
| WO | WO-2015/049838 A1 | 4/2015 |
| WO | WO-2016/002766 A1 | 1/2016 |
| WO | WO-2016/002769 A1 | 1/2016 |
| WO | WO-2017/043606 A1 | 3/2017 |

\* cited by examiner

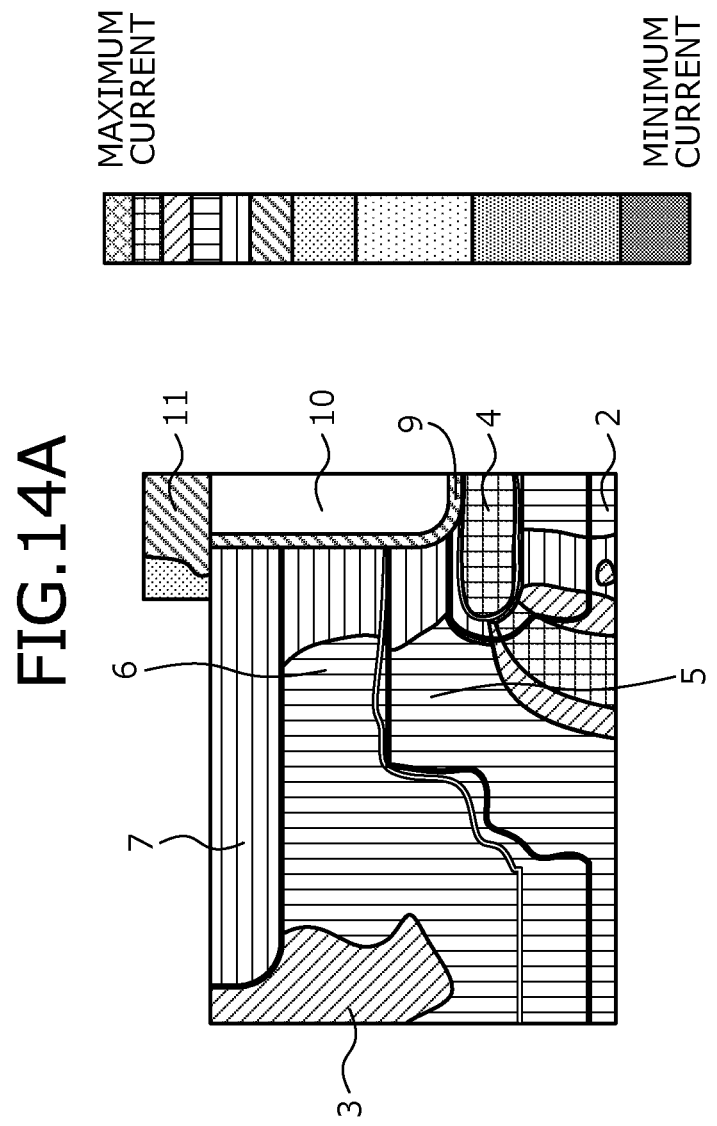

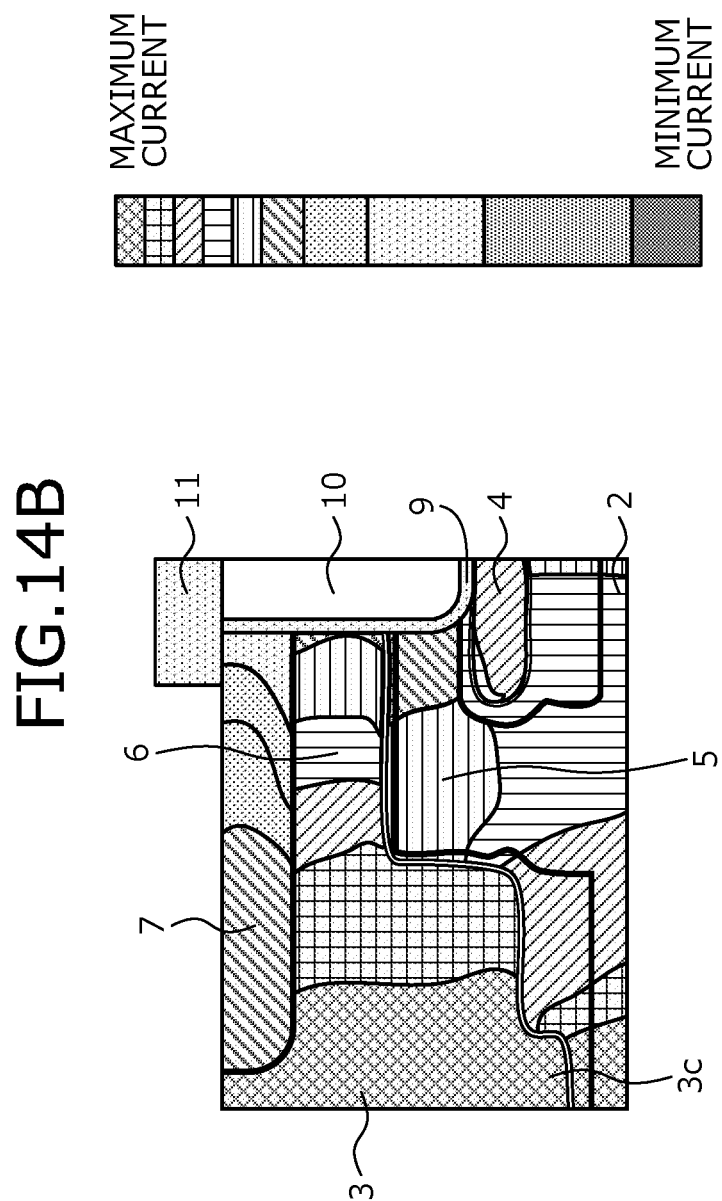

METHOD OF MANUFACTURING SEMICONDUCTOR DEVICE

CROSS REFERENCE TO RELATED APPLICATIONS

This is a divisional of U.S. application Ser. No. 15/909,971, filed on Mar. 1, 2018, and allowed on Sep. 28, 2018, which is a continuation application of International Application PCT/JP2016/076419 filed on Sep. 8, 2016. These applications claim priority from Japanese Patent Application No. 2015-204672 filed on Oct. 16, 2015, the contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, to reduce the ON resistance of an element in a power semiconductor device, a vertical metal oxide semiconductor field effect transistor (MOSFET) having a trench structure is produced. In the vertical MOSFET, the trench structure in which a channel is formed to be orthogonal to a substrate surface enables the cell density per unit area to be increased more easily as compared to a planar structure in which the channel is formed to be parallel to the substrate surface. As a result, the current density per unit area may be increased, which is advantageous in terms of cost.

Nonetheless, to form the channel in an orthogonal direction when a trench structure is formed in a vertical MOSFET, a structure is adopted in which an inner wall of the trench is entirely covered by a gate insulating film. A portion of the gate insulating film at a bottom of the trench is near a drain electrode and therefore, this portion of the gate insulating film is easily subjected to high electric field. In particular, since ultrahigh voltage elements are produced with a wide bandgap semiconductor material (semiconductor material having a wider bandgap than that of silicon such as silicon carbide (SiC)), adverse effects on the gate insulating film at the bottom of the trench significantly reduce reliability.

As a method to resolve such problems, a structure has been proposed in which a p-type region is formed that contacts a p-type base region and reaches a position that is deeper than that of the bottom of the trench, whereby a pn junction is formed at a position deeper than that of the bottom of the trench, to thereby mitigate the electric field strength at the bottom of the trench (for example, refer to Japanese Patent No. 5539931). Further, a structure has been proposed in which a p-type region is formed at the bottom of the trench (for example, refer to U.S. Pat. No. 6,180,958). A further structure has been proposed that combines a structure in which a p-type region that contacts a p-type base region and reaches a position that is deeper than that of the bottom of the trench, whereby a pn junction is formed at a position deeper than that of the bottom of the trench, and a structure in which a p-type region is formed at the bottom of the trench (for example, refer to Japanese Laid-Open Patent Publication No. 2009-260253).

SUMMARY OF THE INVENTION

According to one embodiment of the present invention, a semiconductor device includes a wide bandgap semiconductor substrate of a first conductivity type containing a semiconductor material having a bandgap that is wider than that of silicon, and a wide bandgap semiconductor layer of the first conductivity type formed on a front surface of the wide bandgap semiconductor substrate. The wide bandgap semiconductor layer contains a semiconductor material having a bandgap that is wider than that of silicon, and an impurity concentration of the wide bandgap semiconductor layer is lower than that of the wide bandgap semiconductor substrate.

The semiconductor device further includes a first base region of a second conductivity type formed selectively in a surface layer of the wide bandgap semiconductor layer of the first conductivity type, on a side of the wide bandgap semiconductor layer of the first conductivity type opposite a wide bandgap semiconductor substrate side, and a second base region of the second conductivity type formed selectively in the wide bandgap semiconductor layer of the first conductivity type.

The semiconductor device further includes a region of the first conductivity type formed selectively in the surface layer of the wide bandgap semiconductor layer of the first conductivity type, on the side of the wide bandgap semiconductor layer of the first conductivity type opposite the wide bandgap semiconductor substrate side, an impurity concentration of the region of the first conductivity type being higher than that of the wide bandgap semiconductor layer of the first conductivity type.

The semiconductor device further includes a wide bandgap semiconductor layer of the second conductivity type formed in a surface of the wide bandgap semiconductor layer of the first conductivity type on the side of the wide bandgap semiconductor layer of the first conductivity type opposite the wide bandgap semiconductor substrate side, the wide bandgap semiconductor layer of the second conductivity type containing a semiconductor material having a bandgap that is wider than that of silicon. A source region of the first conductivity type is formed selectively in the wide bandgap semiconductor layer of the second conductivity type.

The semiconductor device further includes a trench penetrating the wide bandgap semiconductor layer of the second conductivity type and the source region, and reaching the region of the first conductivity type, a gate electrode provided in the trench via a gate insulating film, a source electrode in contact with the wide bandgap semiconductor layer of the second conductivity type and the source region, and a drain electrode provided on a rear surface of the wide bandgap semiconductor substrate. The second base region is arranged at all positions facing the trench in the depth direction. A part of the first base region extends toward the trench and is in contact with the second base region.

In the embodiment, a width of the second base region is wider than a width of the trench.

In the embodiment, the trench penetrates the region of the first conductivity type and reaches the second base region.

In the embodiment, the region of the first conductivity type extends between the wide bandgap semiconductor layer of the second conductivity type and a connection part of a part of the first base region and the second base region.

In the embodiment, the semiconductor device has a planar layout in which the connection part of the part of the first base region and the second base region is arranged periodically along a direction orthogonal to a direction in which the first base region and the second base region are arranged, sandwiching the region of the first conductivity type.

In the embodiment, at least one part of an end of the first base region toward the drain electrode is positioned closer than an end of the second base region toward the drain electrode, to the drain electrode.

In the embodiment, the semiconductor device has a planar layout in which a part of an end of the first base region toward the drain electrode, deeper than an end of the second base region toward the drain electrode, is arranged periodically along a direction orthogonal to a direction in which the first base region and the second base region are arranged.

In the embodiment, the semiconductor material having a bandgap wider than that of silicon is silicon carbide.

In the embodiment, the first base region and the second base region are laid out in a grid-like shape from a plan view.

In the embodiment, the region of the first conductivity type is provided between the first base region and the second base region excluding a connection part of the first base region and the second base region.

According to another embodiment of the present invention, a method of manufacturing a semiconductor device includes forming a first wide bandgap semiconductor layer of a first conductivity type on a front surface of a wide bandgap semiconductor substrate of the first conductivity type containing a semiconductor material having a bandgap that is wider than that of silicon, an impurity concentration of the first wide bandgap semiconductor layer of the first conductivity type being lower than that of the wide bandgap semiconductor substrate.

The method further includes selectively forming a first semiconductor region of a second conductivity and a second semiconductor region of the second conductivity type in a surface layer of the first wide bandgap semiconductor layer of the first conductivity type, and forming a second wide bandgap semiconductor layer of the first conductivity type in a surface of the first wide bandgap semiconductor layer of the first conductivity type. The second wide bandgap semiconductor layer of the first conductivity type contains a semiconductor material having a bandgap that is wider than that of silicon, and an impurity concentration of the second wide bandgap semiconductor layer of the first conductivity type is lower than that of the wide bandgap semiconductor substrate.

The method further includes selectively forming a third semiconductor region of the second conductivity type in a surface of the second wide bandgap semiconductor layer of the first conductivity type, the third semiconductor region of the second conductivity type being in contact with the first semiconductor region, and forming a wide bandgap semiconductor layer of the second conductivity type on the surface of the second wide bandgap semiconductor layer of the first conductivity type, the wide bandgap semiconductor layer of the second conductivity type containing a semiconductor material having a bandgap wider than that of silicon.

The method further includes selectively forming a source region of the first conductivity type in the wide bandgap semiconductor layer of the second conductivity type, and forming (e.g., all) trenches that penetrate the source region and the wide bandgap semiconductor layer of the second conductivity type and reach the second wide bandgap semiconductor layer of the first conductivity type, at positions facing the second semiconductor regions in a depth direction.

The method further includes forming a gate electrode in the trench via a gate insulating film, forming a source electrode to be in contact with the wide bandgap semiconductor layer of the second conductivity type and the source region, and forming a drain electrode on a rear surface of the wide bandgap semiconductor substrate. In selectively forming the first semiconductor region of a second conductivity type and the second semiconductor region of the second conductivity type, a part of the first semiconductor region and the second semiconductor region are connected so that the first wide bandgap semiconductor layer of the first conductivity type between the first semiconductor region and the second semiconductor region remains.

In the embodiment, the third semiconductor region is formed to be in contact with a part of the first base region other than a connection part with the second base region.

In the embodiment, the method includes forming a first region of the first conductivity type after a first process and before a third process, the first region of the first conductivity type being formed between the first semiconductor region and the second semiconductor region in the surface layer of the first wide bandgap semiconductor layer of the first conductivity type.

In the embodiment, the method includes selectively forming a second region of the first conductivity type after the third process and before a fifth process, the second region of the first conductivity type formed in the surface layer of the second wide bandgap semiconductor layer of the first conductivity type and in contact with the first region.

In the embodiment, the method includes forming a fourth semiconductor region of the second conductivity type after the first process and before the third process, the fourth semiconductor region of the second conductivity type being formed at a position deeper than a position of the first semiconductor region and formed to be in contact with the first semiconductor region.

In the embodiment, the first semiconductor region and the second semiconductor region are formed to have a grid-like shape layout from a plan view.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 14A and 14B are current distribution diagrams for avalanche breakdown in the comparison example and the Example of the silicon carbide semiconductor device according to the second embodiment.

DETAILED DESCRIPTION OF THE INVENTION

Figure 1A:
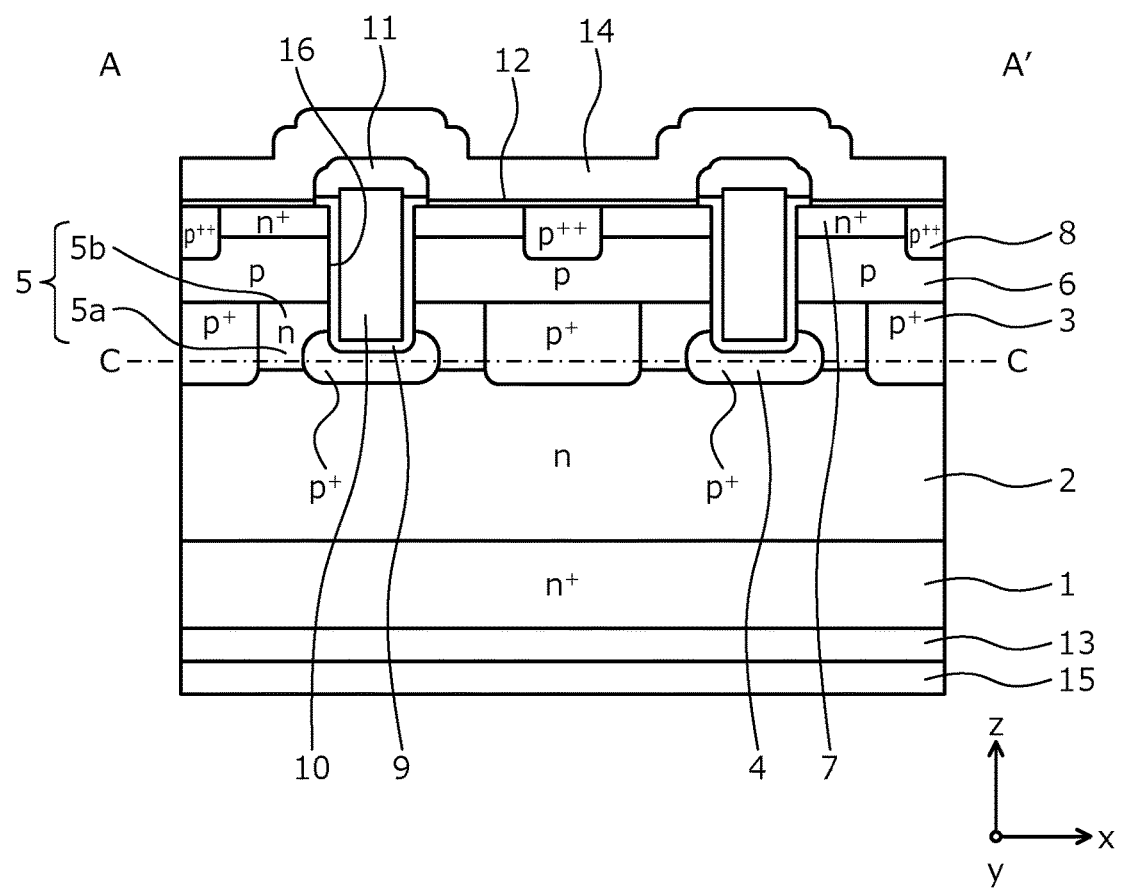
FIG. 1A is a cross-sectional view of a configuration of a silicon carbide semiconductor device according to a first embodiment.

Manufacturing is extremely difficult when a pn junction is formed using the technique in Japanese Patent No. 5539931 because the breakdown voltage cannot be secured when the pn junction is formed at a position deeper than that of the bottom of the trench or a position near the trench. When a p-type region is formed using the technique in U.S. Pat. No. 6,180,958, a high electric field tends to be applied to the gate insulating film on the side wall of the trench and the current path narrows in the ON state, whereby the ON resistance increases. When both a deep p-type region at a position separated from the trench and a p-type region at the bottom of the trench are formed using the technique in Japanese Laid-Open Patent Publication No. 2009-260253, the width of the p-type region at the bottom of the trench is made smaller than the width of the trench to reduce the ON resistance and as a result, the high electric field applied at corner portions of the bottom of the trench is not mitigated. Further, in Japanese Laid-Open Patent Publication No. 2009-260253, the pn junction is formed widely in a region directly beneath the trench (trench side), whereby the breakdown voltage of the active region rises close to the performance limitation of the wide bandgap semiconductor material. As a result, the breakdown voltage of the active region tends to become the breakdown voltage of the edge termination region or higher and may reduce the capability of the element.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without+ or −, and represents one example. Cases where symbols such as n's and p's that include + or − are the same indicate that concentrations are close and therefore, the concentrations are not necessarily equal. In the description of the embodiments below and the accompanying drawings, main portions that are similar will be given the same reference numerals and will not be repeatedly described. Further, in the present description, when Miller indices are described, "−" means a bar added to an index immediately after the "−", and a negative index is expressed by prefixing "−" to the index.

The semiconductor device according to the present invention is configured using a wide bandgap semiconductor material. In the embodiments, a silicon carbide semiconductor device produced using, for example, silicon carbide (SiC) as a wide bandgap semiconductor will be described taking a MOSFET as an example. FIG. 1A is a cross-sectional view of a configuration of the silicon carbide semiconductor device according to the first embodiment.

As depicted in FIG. 1A, in the silicon carbide semiconductor device according to the embodiment, on a first main surface (front surface), e.g., (0001) plane (Si face) of an n+-type silicon carbide substrate (wide bandgap semiconductor substrate of a first conductivity type) 1, an n-type silicon carbide epitaxial layer (first wide bandgap semiconductor layer of the first conductivity type) 2 is deposited.

The n+-type silicon carbide substrate 1 is, for example, a silicon carbide single-crystal substrate doped with nitrogen (N). The n-type silicon carbide epitaxial layer 2 has an impurity concentration that is lower than that of the n+-type silicon carbide substrate 1 and is, for example, a low-concentration n-type drift layer doped with nitrogen. In a surface side of the n-type silicon carbide epitaxial layer 2, opposite the side facing the n+-type silicon carbide substrate 1, an n-type high-concentration region (region of the first conductivity type) 5 is formed. An impurity concentration of the n-type high-concentration region 5 is lower than that of the n+-type silicon carbide substrate 1 and higher than that of the n-type silicon carbide epitaxial layer 2 and, for example, the n-type high-concentration region 5 is a high-concentration n-type drift layer doped with nitrogen. Hereinafter, the n+-type silicon carbide substrate 1, the n-type silicon carbide epitaxial layer 2, and a p-type base layer (wide bandgap semiconductor layer of the second conductivity type) 6 described hereinafter are collectively regarded as a silicon carbide semiconductor base.

As depicted in FIG. 1A, on a second main surface (rear surface, i.e., a rear surface of the silicon carbide semiconductor base) of the n+-type silicon carbide substrate 1, a rear electrode (drain electrode) 13 is provided. The rear electrode 13 constitutes a drain electrode. On the surface of the rear electrode 13, a drain electrode pad 15 is provided.

On the first main surface side (p-type base layer 6 side) of the silicon carbide semiconductor base, a trench structure is formed. In particular, a trench 16 penetrates the p-type base layer 6 from a surface on the side (first main surface side of the silicon carbide semiconductor base) of the p-type base layer 6, opposite the side facing the n+-type silicon carbide substrate 1, and reaches the n-type high-concentration region 5. A gate insulating film 9 is formed along inner walls of the trench 16 and at the bottom and side walls of the trench 16; and on the gate insulating film 9 in the trench 16, a gate electrode 10 is formed. The gate electrode 10 is insulated from the n-type silicon carbide epitaxial layer 2 and the p-type base layer 6 by the gate insulating film 9. The gate electrode 10 may partially protrude from a top (aspect facing toward a source electrode pad 14) of the trench 16 toward the source electrode pad 14.

In a surface layer of the n-type silicon carbide epitaxial layer 2, on the side (first main surface side of the silicon carbide semiconductor base) of n-type silicon carbide epitaxial layer 2 opposite the side facing the n$^+$-type silicon carbide substrate 1, a first p$^+$-type base region (first base region of the second conductivity type) 3 and a second p$^+$-type base region (second base region of the second conductivity type) 4 are selectively provided. The first p$^+$-type base region 3 reaches a position deeper on the drain side than the bottom of the trench 16. A lower end (end on the drain side) of the first p$^+$-type base region 3 is positioned farther on the drain side than the bottom of the trench 16. A lower end of the second p$^+$-type base region 4 is positioned farther on the drain side than the bottom of the trench 16. The second p$^+$-type base region 4 is formed at a position facing the bottom of the trench 16 in a depth direction z. A width of the second p$^+$-type base region 4 is wider than a width of the trench 16. The bottom of the trench 16 may reach the second p$^+$-type base region 4, or may be positioned in the n-type high-concentration region 5 that is between the p-type base layer 6 and the second p$^+$-type base region 4, and the bottom need not contact the second p$^+$-type base region 4. The first p$^+$-type base region 3 and the second p$^+$-type base region 4, for example, are doped with aluminum (Al).

Figure 1B:
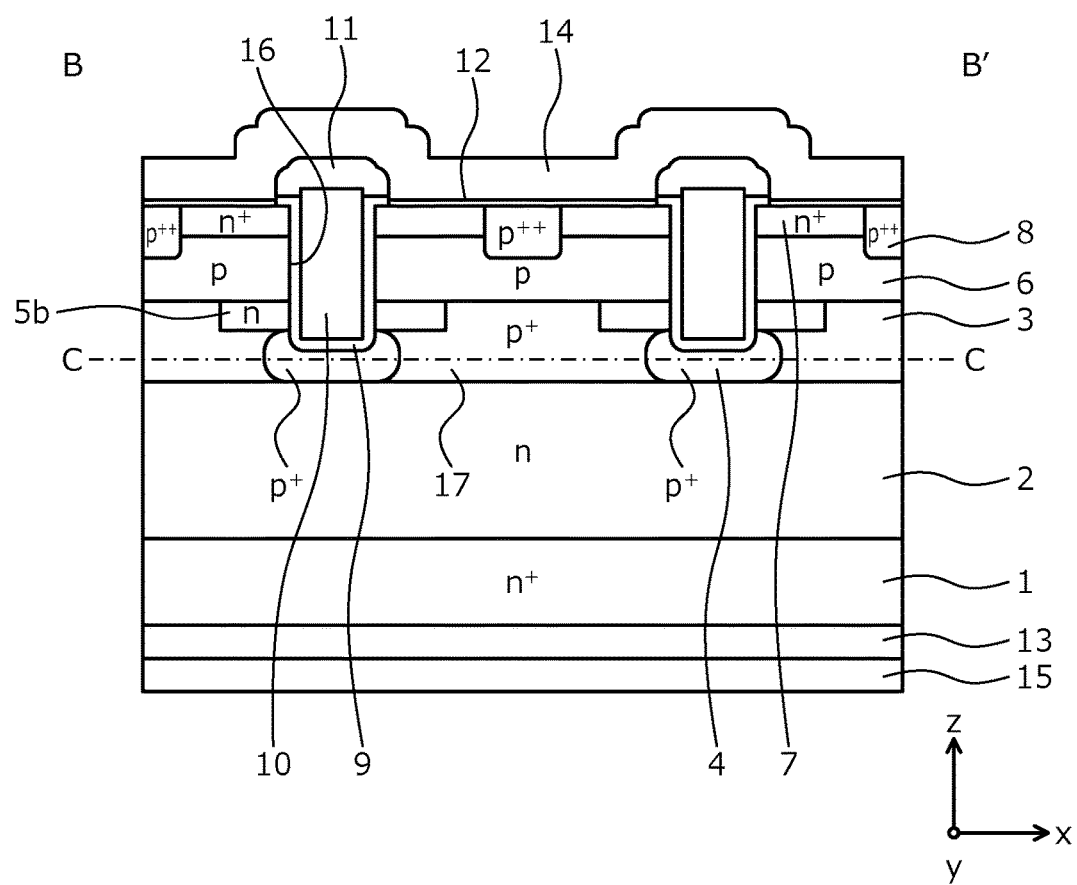
FIG. 1B is a view of a cross-sectional structure at cutting line B-B' in FIG. 2.
Figure 2:
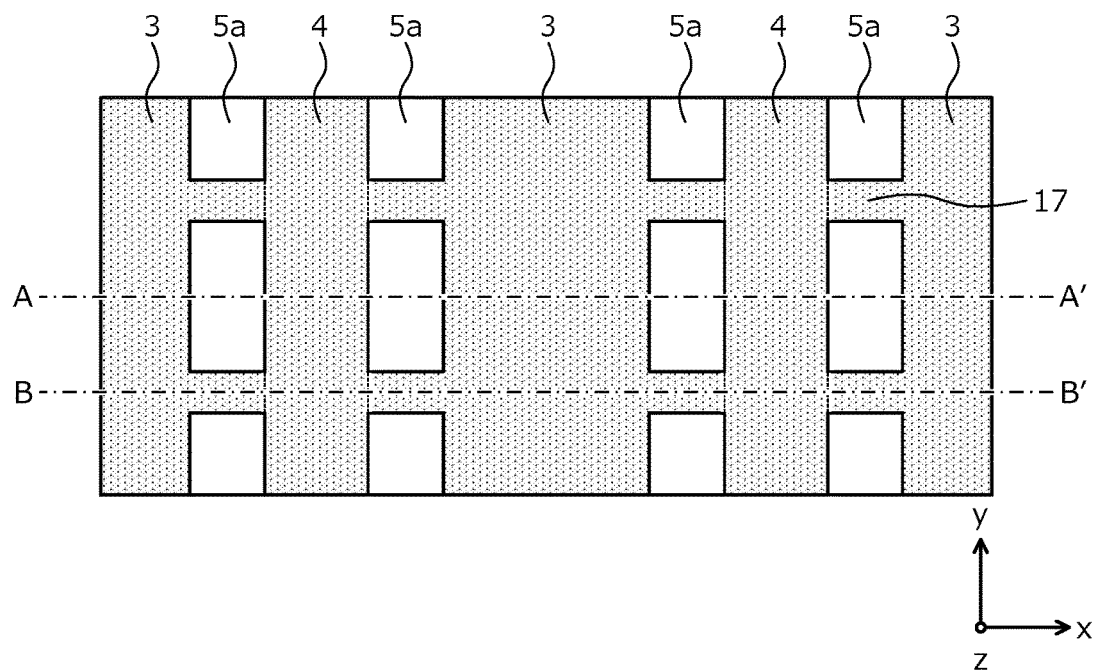
FIG. 2 is view of a planar layout at cutting line C-C in FIGS. 1A, 1B.

A part 17 of the first p$^+$-type base region 3 extends on the trench 16 side to be connected to the second p$^+$-type base region 4. In this case, the part 17 (refer to FIG. 2) of the first p$^+$-type base region 3 may have a planar layout in which the part 17 is alternately arranged with the n-type high-concentration region 5 in a direction (hereinafter, second direction) y orthogonal to a direction (hereinafter, first direction) x in which the first p$^+$-type base region 3 and the second p$^+$-type base region 4 are arranged. An example of the planar layout of the first and second p-type base regions 3, 4 is depicted in FIG. 2. FIG. 2 is a plan view of example of the planar layout of the silicon carbide semiconductor device according to the first embodiment. In this example, FIG. 1A depicts a cross-sectional structure at cutting line A-A' in FIG. 2; FIG. 1B depicts a cross-sectional structure at cutting line B-B' in FIG. 2. FIG. 2 is a planar layout at cutting line C-C in FIGS. 1A, 1B. In FIG. 2, boundaries between the first p$^+$-type base regions 3 and the second p$^+$-type base regions 4 are indicated by vertical dotted lines. The first and the second p-type base regions 3, 4 are depicted to be connected by the part 17 of the first p$^+$-type base region 3 (hatched portion).

As depicted in FIG. 2, farther on the drain side than the bottom of the trench 16, the part 17 of the first p$^+$-type base region 3, for example, extends toward the trenches 16 on both sides along the first direction x and is connected to a part of the second p$^+$-type base region 4. Between the parts 17 of the first p$^+$-type base regions 3 adjacent along the second direction y, a part 5a of the n-type high-concentration region 5 on the drain side is arranged, i.e., the parts 17 (part connecting the first and second p-type base regions 3, 4) of the first p$^+$-type base regions 3 are periodically arranged along the second direction y, sandwiching the parts 5a of the n-type high-concentration regions 5 on the drain side. Further, the first p$^+$-type base regions 3 and the second p$^+$-type base regions 4 have a grid-like layout in a plan view. The n-type high-concentration region 5 extends between the part 17 of the first p$^+$-type base region 3 and the p-type base layer 6, i.e., at parts exposed at the side walls of the trench 16, parts 5b of the n-type high-concentration region 5 on the source side are arranged between the p-type base layer 6 and the first and second p-type base regions 3, 4, and a part of a side face of the trench 16 is covered by an n-type region (FIG. 1B). As a result, holes that are generated when avalanche breakdown occurs at a junction portion of the second p$^+$-type base region 4 and the n-type silicon carbide epitaxial layer 2 are efficiently migrated to a source electrode 12, whereby the load on the gate insulating film 9 is reduced, improving reliability.

The p-type base layer (wide bandgap semiconductor layer of the second conductivity type) 6 is provided on a base first main surface side of the n-type silicon carbide epitaxial layer 2. The p-type base layer 6 contacts the first p$^+$-type base region 3. An impurity concentration of the p-type base layer 6, for example, may be lower than the impurity concentration of the first p$^+$-type base region 3. As a result, to lower the threshold voltage even when the concentration of the p-type base layer 6 is lowered, decreases in the breakdown voltage due to punch-through may be avoided by suppressing the spreading of a depletion layer of the p-type base layer 6. In the p-type base layer 6, on the base first main surface side, an n$^+$ source region (source region of the first conductivity) 7 and a p$^{++}$ contact region (contact region of the second conductivity) 8 are selectively provided. Further, the n$^+$ source region 7 and the p$^{++}$ contact region 8 contact each other. The n-type high-concentration region 5 is provided in a region between the first p$^+$-type base region 3 of the surface layer on the base first main surface side of the n-type silicon carbide epitaxial layer 2 and the second p$^+$-type base region 4, and in a region between the p-type base layer 6 and the second p$^+$-type base region 4.

In FIG. 1A, while only two trench MOS structures are depicted, more MOS gate (insulated gate constituted by a metal-oxide-semiconductor) structures of a trench structure may be further arranged in parallel.

An interlayer insulating film 11 is provided on the entire first main surface side of the silicon carbide semiconductor base so as to cover the gate electrode 10 embedded in the trench. The source electrode 12 contacts the n$^+$ source region 7 and the p$^{++}$ contact region 8 via a contact hole opened in the interlayer insulating film 11. The source electrode 12 is electrically insulated from the gate electrode 10 by the interlayer insulating film 11. On the source electrode 12, the source electrode pad 14 is provided.

A method of manufacturing the silicon carbide semiconductor device according to the present embodiment will be described. FIGS. 3, 4, 5, 6, 7, and 8 are cross-sectional views of the silicon carbide semiconductor device according to the present embodiment during manufacture.

Figure 3:
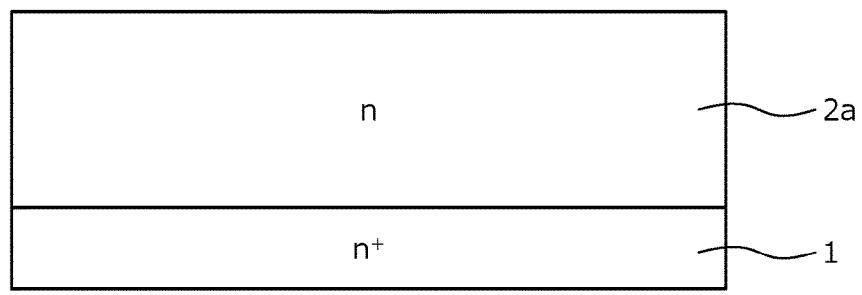
FIG. 3 is a cross-sectional view (part 1) of the silicon carbide semiconductor device according to the present embodiment during manufacture.

The n$^+$-type silicon carbide substrate 1 containing an n-type silicon carbide is prepared. On the first main surface of the n$^+$-type silicon carbide substrate 1, a first n-type silicon carbide epitaxial layer (first wide bandgap semiconductor layer of the first conductivity type) 2a containing a silicon carbide is formed by epitaxial growth to a thickness of, for example, about 30 μm while an n-type impurity, e.g., nitrogen atoms, is doped. The first n-type silicon carbide epitaxial layer 2a forms the n-type silicon carbide epitaxial layer 2. The state up to here is depicted in FIG. 3.

Next, on the surface of the first n-type silicon carbide epitaxial layer 2a, by photolithography, a mask (not depicted) having predetermined openings is formed using, for example, an oxide film. A p-type impurity, e.g., aluminum atoms, is ion-implanted using the oxide film as a mask. As a result, in parts of a surface region of the first n-type silicon carbide epitaxial layer 2a, for example, the second p$^+$-type base region (second semiconductor region of the second conductivity) 4 and a first p-type region (first semiconductor region of the second conductivity) 3a are formed at a depth of about 0.5 μm, for example, so that a distance between the adjacent first p-type region 3a and second p$^+$-type base region 4 is about 1.5 μm. A dose amount at the time of ion implantation for forming the first p-type regions 3a and the second p⁺-type base regions 4, for example, may be set such that the impurity concentration becomes about $5\times10^{18}/cm^3$. Further, the first p-type regions 3a and the second p⁺-type base regions 4 may be formed to have a grid-like plan view.

Figure 4:
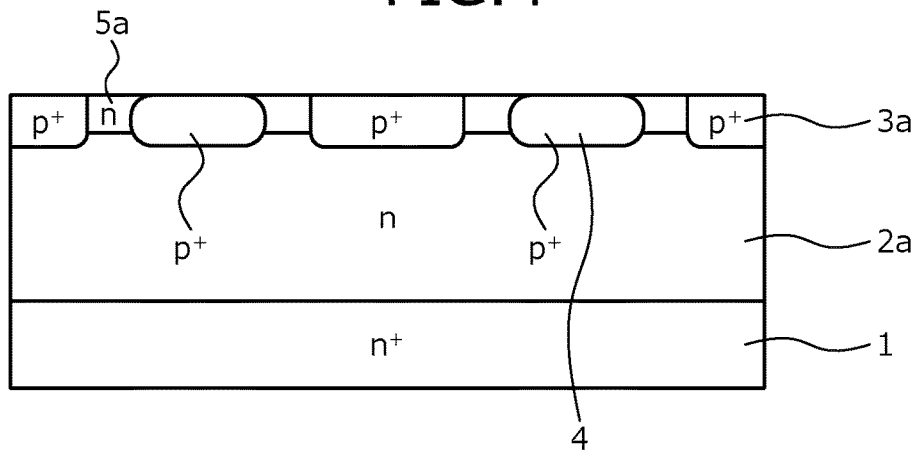
FIG. 4 is a cross-sectional view (part 2) of the silicon carbide semiconductor device according to the present embodiment during manufacture.

Next, the mask used in the ion implantation for forming the first p-type regions 3a and the second p⁺-type base regions 4 is removed. Subsequently, an n-type impurity, e.g., nitrogen atoms, is ion-implanted. As a result, between the first p-type regions 3a and the second p⁺-type base regions 4 of the surface layer of the first n-type silicon carbide epitaxial layer 2a, a first n-type region (first region of the first conductivity) 5a at, for example, a depth of about 0.5 µm or less is formed. A dose amount at the time of ion implantation for forming the first n-type regions 5a, for example, may be set such that the impurity concentration becomes about $1\times10^{17}/cm^3$. The state up to here is depicted in FIG. 4.

Next, on the surface of the first n-type silicon carbide epitaxial layer 2a, while an n-type impurity, e.g., nitrogen atoms, is doped, a second n-type silicon carbide epitaxial layer (second wide bandgap semiconductor layer of the first conductivity type) 2b is formed by epitaxial growth so that, for example, a thickness thereof is about 0.5 µm. The second n-type silicon carbide epitaxial layer 2b and the first n-type silicon carbide epitaxial layer 2a are collectively the n-type silicon carbide epitaxial layer 2. Conditions of the epitaxial growth for forming the second n-type silicon carbide epitaxial layer 2b, for example, may be set so that the impurity concentration of the second n-type silicon carbide epitaxial layer 2b becomes about $3\times10^{15}/cm^3$.

Next, on the surface of the n-type silicon carbide epitaxial layer 2, by photolithography, a mask (not depicted) having predetermined openings is formed using, for example, an oxide film. A p-type impurity, e.g., aluminum atoms, is ion-implanted using the oxide film as a mask, whereby in parts of the surface layer of the n-type silicon carbide epitaxial layer 2, a second p-type region (third semiconductor region of the second conductivity) 3b at a depth of, for example, about 0.5 µm is formed so that, for example, each overlaps the top of a first p-type region 3a. The second p-type regions 3b and the first p-type regions 3a are collectively the first p⁺-type base regions 3. A dose amount at the time of the ion implantation for forming the second p-type regions 3b, for example, may be such that the impurity concentration becomes about $5\times10^{18}/cm^3$.

Figure 5:
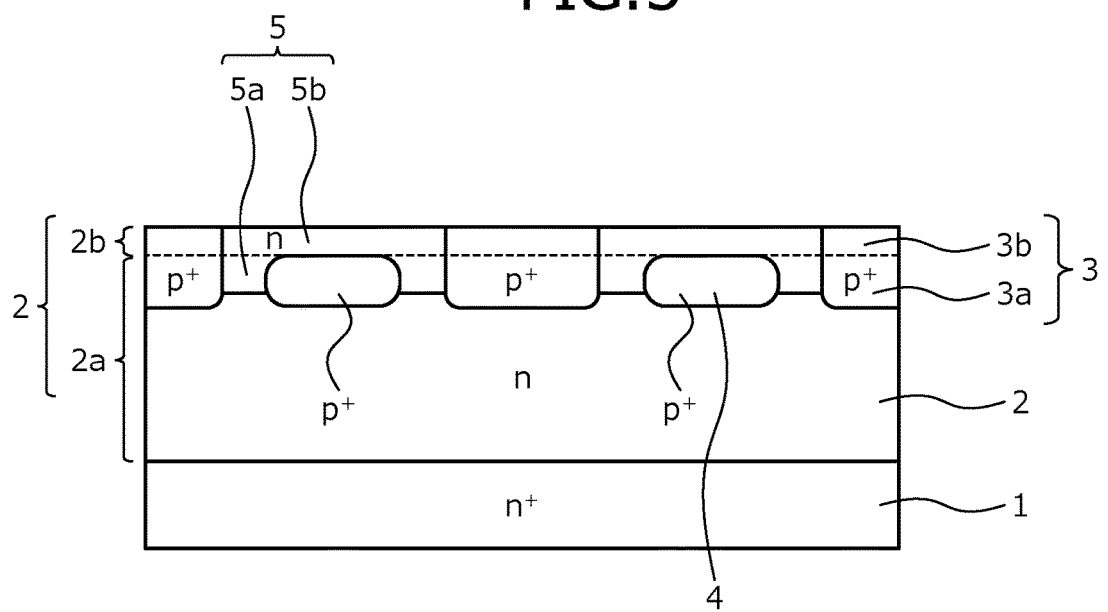
FIG. 5 is a cross-sectional view (part 3) of the silicon carbide semiconductor device according to the present embodiment during manufacture.

Next, the mask used in the ion implantation for the second p-type regions 3b is removed. Subsequently, an n-type impurity, e.g., nitrogen atoms, is ion-implanted. As a result, in parts of the surface layer of the second n-type silicon carbide epitaxial layer 2b, a second n-type region (second region of the first conductivity type) 5b at a depth of, for example, about 0.5 µm is formed so as to contact the first p-type regions 3a, the second p⁺-type base regions 4, and the first n-type regions 5a. A dose amount at the time of ion implantation for the second n-type regions 5b, for example, may be set so that the impurity concentration becomes about $1\times10^{17}/cm^3$. The second n-type regions 5b and the first n-type regions 5a are collectively the n-type high-concentration regions 5. The state up to here is depicted in FIG. 5.

Next, on the surface of the n-type silicon carbide epitaxial layer 2 (i.e., surfaces of the first p⁺-type base regions 3 and the second n-type regions 5b), while a p-type impurity, e.g., aluminum atoms, is doped, the p-type base layer (wide bandgap semiconductor layer of the second conductivity type) 6 is formed by epitaxial growth and a thickness thereof is, for example, about 1.3 µm. Conditions of the epitaxial growth for forming the p-type base layers 6, for example, may be such that the concentration becomes about $4\times10^{17}/cm^3$, which is lower than the impurity concentration of the first p⁺-type base region 3. By the processes up to here, the n-type silicon carbide epitaxial layer 2 and the p-type base layer 6 are stacked on the n⁺-type silicon carbide substrate 1, forming the silicon carbide semiconductor base.

Next, on the surface of the p-type base layer 6, by photolithography, a mask (not depicted) having predetermined openings is formed using, for example, an oxide film. An n-type impurity, e.g., phosphorus (P) is ion-implanted using the oxide film as a mask, whereby in parts of the surface layer of the p-type base layer 6, the n⁺ source region (source region of the first conductivity) 7 is formed. A dose amount at the time of the ion implantation for the n⁺ source regions 7 may be set such that, for example, the impurity concentration becomes higher than the impurity concentration of the first p⁺-type base region 3. Next, the mask used in the ion implantation for the n⁺ source regions 7 is removed.

Figure 6:
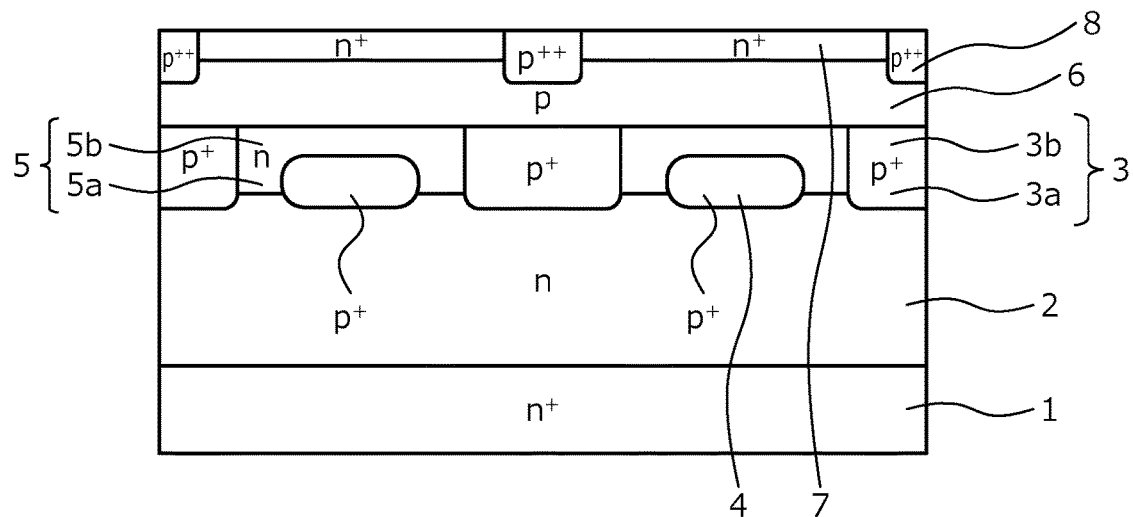
FIG. 6 is a cross-sectional view (part 4) of the silicon carbide semiconductor device according to the present embodiment during manufacture.

Subsequently, on the surface of the p-type base layer 6, by photolithography, a mask (not depicted) having predetermined openings is formed using, for example, an oxide film and a p-type impurity, e.g., aluminum, is ion-implanted in the surface of the p-type base layer 6, using the oxide film as a mask. As a result, in parts of a surface region of the p-type base layer 6, the p⁺⁺ contact region (contact region of the second conductivity) 8 is formed. A dose amount at the time of the ion implantation for the p⁺⁺ contact regions 8, for example, may be set so that the impurity concentration becomes higher than that of the second p⁺-type base region 4. Next, the mask used in the ion implantation for the p⁺⁺ contact regions 8 is removed. The sequence of the ion implantation for the n⁺ source regions 7 and the ion implantation for the p⁺⁺ contact regions 8 may be interchanged. The state up to here is depicted in FIG. 6.

Next, heat treatment (annealing) is performed and, for example, the first p-type regions 3a, the second p-type regions 3b, the n⁺ source regions 7, and the p⁺⁺ contact regions 8 are activated. A temperature of the heat treatment, for example, may be about 1700 degrees C. A period of the heat treatment, for example, may be about 2 minutes. As described, the ion-implanted regions may be collectively activated by a single heat treatment session, or the heat treatment may be performed for activation each time the ion implantation is performed.

Figure 7:
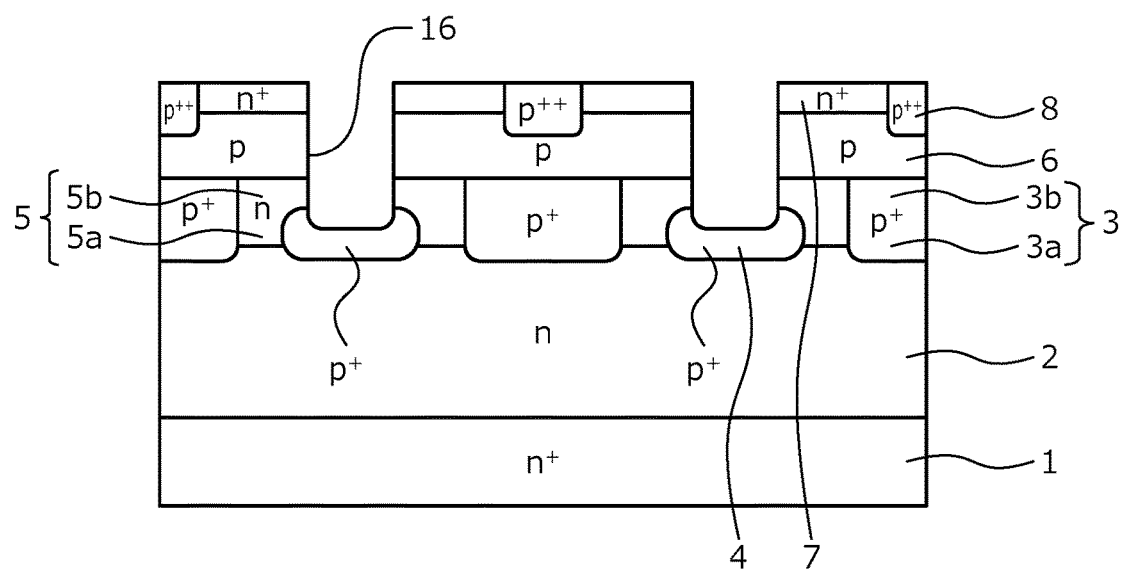
FIG. 7 is a cross-sectional view (part 5) of the silicon carbide semiconductor device according to the present embodiment during manufacture.

Next, on the surface of the p-type base layer 6 (i.e., surfaces of the n⁺ source regions 7 and the p⁺⁺ contact regions 8), by photolithography, a mask (not depicted) having predetermined openings is formed using, for example, an oxide film. By dry etching or the like using the oxide film as a mask, the trenches 16 are formed penetrating the n⁺ source regions 7 and the p-type base layers 6 and reaching the n-type high-concentration regions 5. The bottoms of the trenches 16 may reach the second p⁺-type base regions 4, or may be positioned in the n-type high-concentration regions 5 between the p-type base layers 6 and the second p⁺-type base regions 4. Next, the mask used for forming the trenches 16 is removed. The state up to here is depicted in FIG. 7.

Next, the gate insulating film 9 is formed along the surfaces of the n⁺ source regions 7 and the p⁺⁺ contact regions 8, and along the bottoms and the side walls of the trenches 16. The gate insulating film 9 may be formed by thermal oxidation by heat treatment at a temperature of 1000 degrees C. in an oxygen atmosphere. Further, the gate insulating film 9 may be formed by a deposition method by a chemical reaction such as high temperature oxidation (High Temperature Oxide: HTO), etc.

Next, on the gate insulating film 9, a multi-crystal silicon layer is formed while, for example, phosphorus atoms are doped. The multi-crystal silicon layer is formed so as to be embedded in the trenches 16. The multi-crystal silicon layer is patterned and left in the trenches 16, whereby the gate electrodes 10 are formed. A part of the gate electrodes 10 may protrude from the tops of the trenches 16 (the source electrode pad 14 side) toward the source electrode pad 14.

Figure 8:
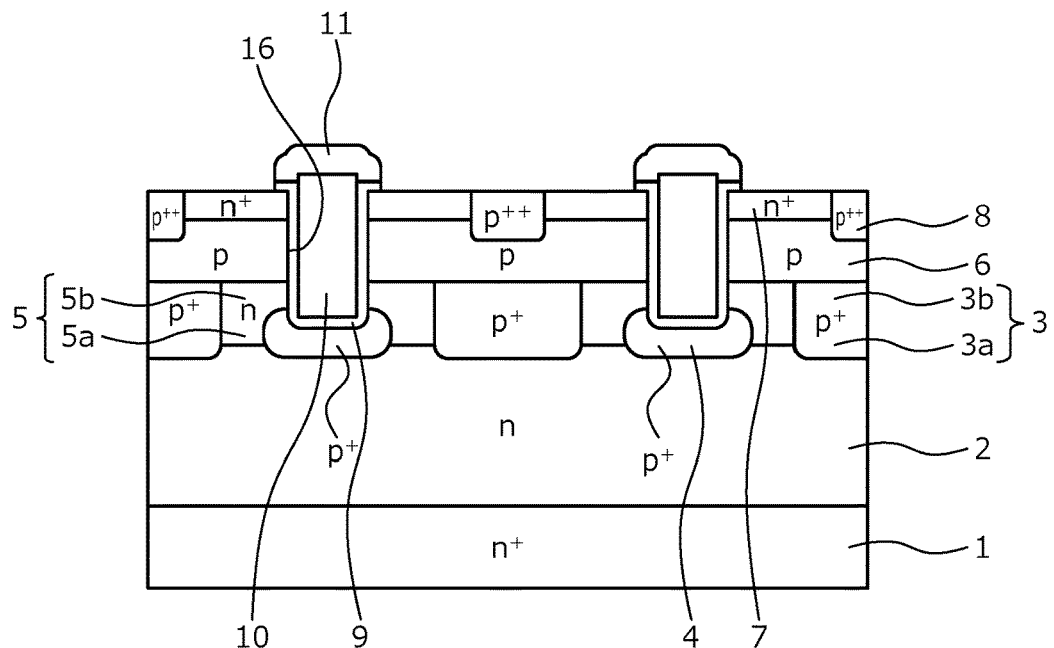
FIG. 8 is a cross-sectional view (part 6) of the silicon carbide semiconductor device according to the present embodiment during manufacture.

Next, for example, phosphate glass of a thickness of about 1 μm is formed so as to cover the gate insulating film 9 and the gate electrodes 10 to thereby form the interlayer insulating film 11. The interlayer insulating film 11 and the gate insulating film 9 are patterned and selectively removed to form contact holes and thereby expose the $n^+$ source regions 7 and the $p^{++}$ contact regions 8. Thereafter, heat treatment (reflow) is performed, planarizing the interlayer insulating film 11. The state up to here is depicted in FIG. 8.

Subsequently, in the contact holes and on the interlayer insulating film 11, a conductive film that constitutes the source electrode 12 is formed. The conductive film is selectively removed to leave, for example, the source electrode 12 only in the contact holes.

Next, on the second main surface of the $n^+$-type silicon carbide substrate 1, the drain electrode 13, for example, constituted by a (Ni) film is formed. Thereafter, for example, heat treatment at a temperature of about 970 degrees C. is performed, forming an ohmic junction between the $n^+$-type silicon carbide substrate 1 and the drain electrode 13.

Next, for example, an aluminum film is formed by, for example, sputtering, so as to cover the source electrode 12 and the interlayer insulating film 11 and a thickness thereof is, for example, about 5 μm. Thereafter, the aluminum film is selectively removed so that the portion that remains covers the active region of the entire element whereby the source electrode pad 14 is formed.

Next, on the surface of the drain electrode 13, for example, titanium (Ti), nickel, and gold (Au) are sequentially stacked to form the drain electrode pad 15, whereby the semiconductor device depicted in FIG. 1 is completed.

Figure 9:
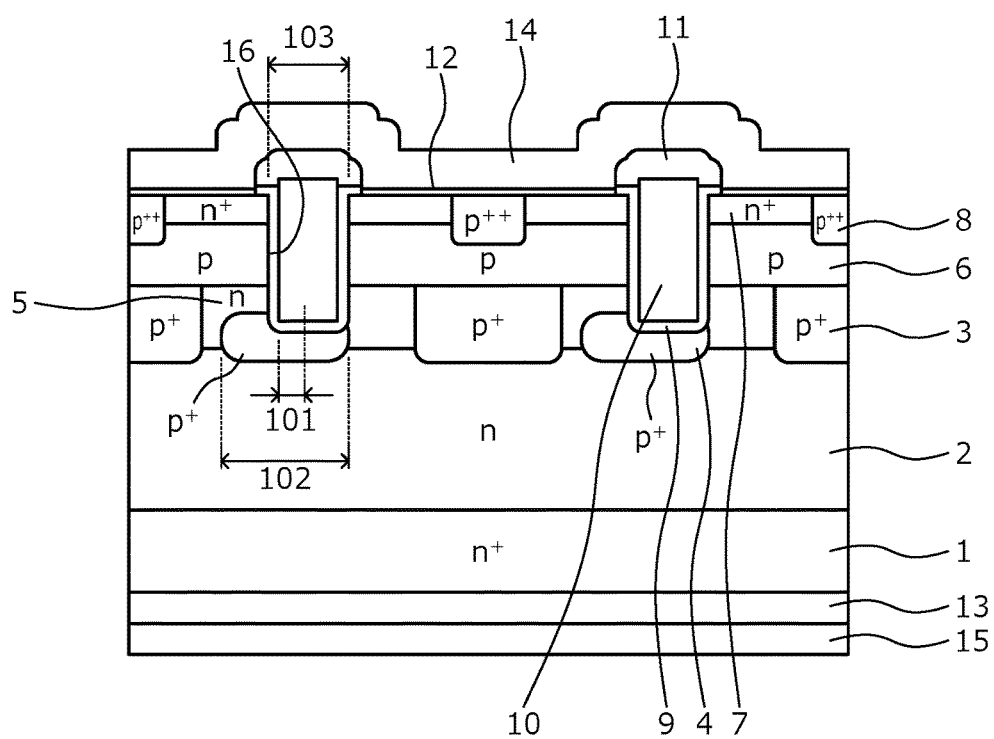
FIG. 9 is a cross-sectional view of an example in which positions of trenches and second p+-type base regions are shifted along a horizontal direction in an Example of the silicon carbide semiconductor device according to the first embodiment.

FIG. 9 is a cross-sectional view of an example in which positions of the trenches and the second $p^+$-type base regions are shifted along a horizontal direction in an Example of the silicon carbide semiconductor device according to the first embodiment. The horizontal direction is the direction along which the first and second p-type base regions 3, 4 are arranged. Here, a misalignment amount 101 is the distance (unit: μm) along the horizontal direction between a center of the second $p^+$-type base region 4 and a center of the trench 16; a p-type base region width 102 is a width of the second $p^+$-type base region 4 (unit: μm); and a trench width 103 is a width of the trench 16 (unit: μm).

Figure 10:
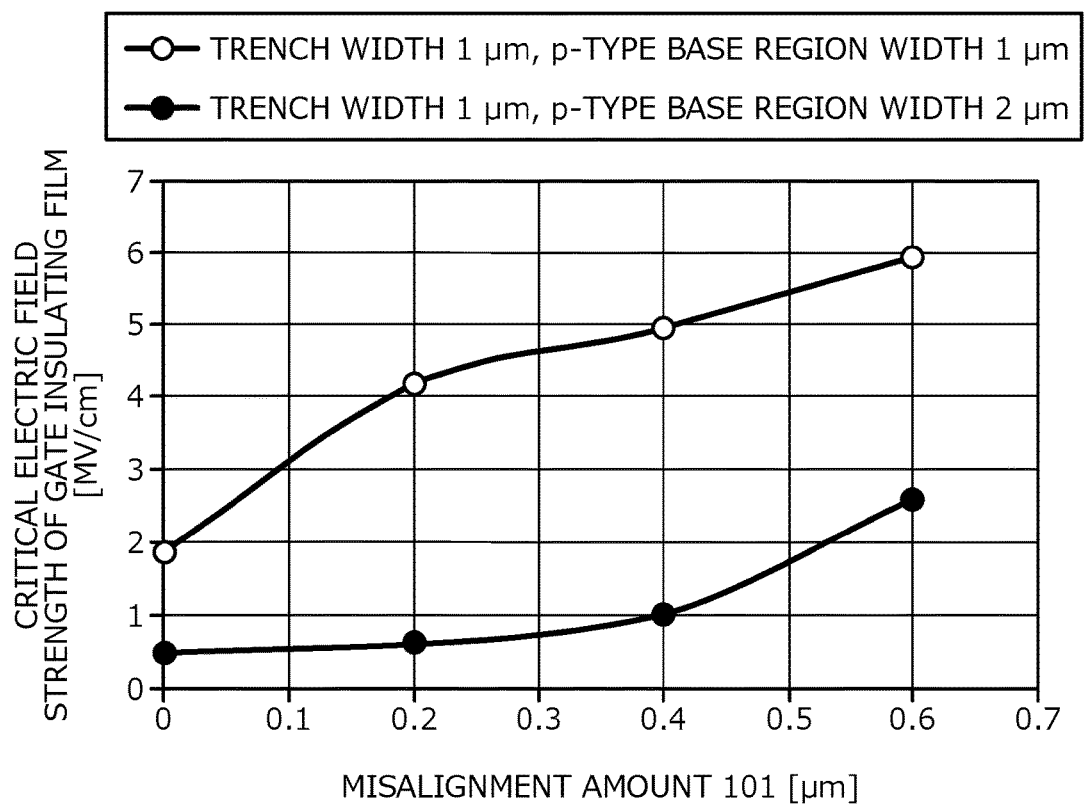
FIG. 10 is a characteristics diagram of critical field strength of a gate insulating film of the Example of the silicon carbide semiconductor device according to the first embodiment.

FIG. 10 is a characteristics diagram of the critical field strength of the gate insulating film of the Example of the silicon carbide semiconductor device according to the first embodiment. FIG. 10 depicts the results of simulation of variation of the electric field of the gate insulating film 9 when the center of the trench 16 shifts from the center of the second $p^+$-type base region 4 along the horizontal direction due to misalignment of the second $p^+$-type base region 4 directly beneath the trench 16. In FIG. 10, the relationship of the critical field strength of the gate insulating film 9 with respect to misalignment of a comparison example is depicted. In the structure of the comparison example (not depicted), the p-type base region width 102 is set to be 1 μm and the trench width 103 is set to be 1 μm. Other than the p-type base region width 102, the configuration of the comparison example is the same as that of the Example. In the structure of the Example, the p-type base region width 102 is set to be 2 μm and the trench width 103 is set to be 1 μm.

In FIG. 10, the vertical axis represents the critical field strength (unit: MV/cm) of the gate insulating film 9 and the horizontal axis represents the misalignment amount 101 of the positions of the trench 16 and the second $p^+$-type base region 4 along the horizontal direction. FIG. 10 depicts the results of simulation of the critical field strength of the gate insulating film 9 for the Example and the comparison example; and is a characteristics diagram depicting one example of the relationship between the misalignment amount 101 and the critical field strength of the gate insulating film 9 when 4000V is applied to the drain. As depicted in FIG. 10, simulation results confirm that when voltage is applied to the drain side, the critical field strength for the gate insulating film 9 improves more for the Example in which the p-type base region width 102 is wider than the trench width 103, than for the comparison example in which the p-type base region width 102 and the trench width 103 are the same width.

Figure 11:
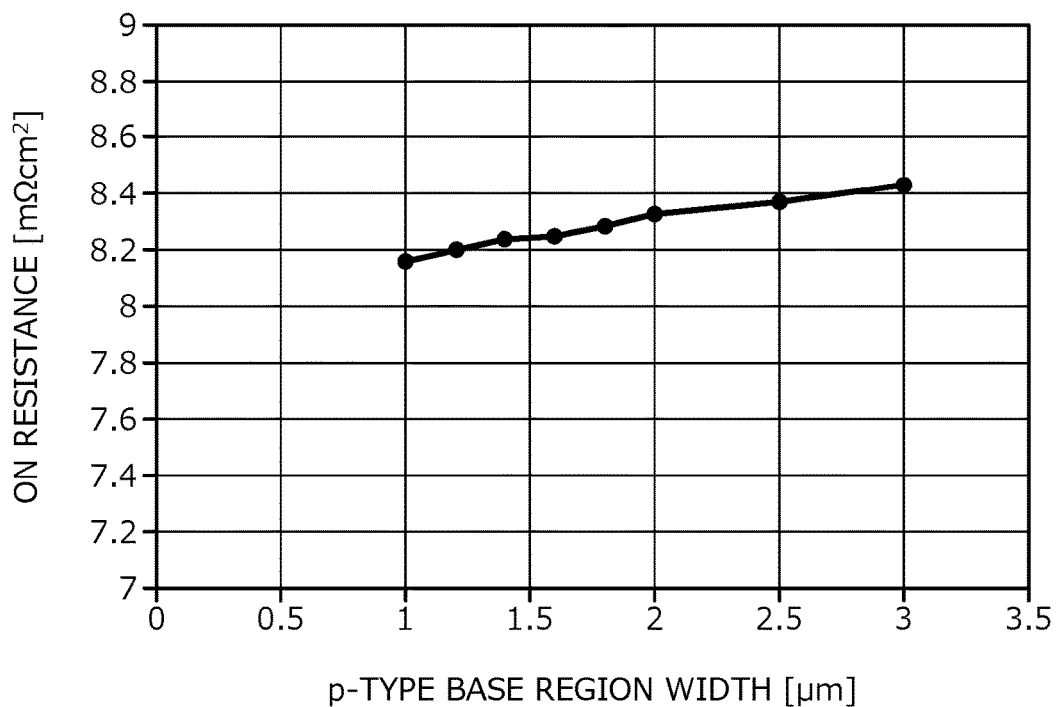
FIG. 11 is a characteristics diagram of ON resistance of the Example of the silicon carbide semiconductor device according to the first embodiment.

FIG. 11 is a characteristics diagram of the ON resistance of the Example of the silicon carbide semiconductor device according to the first embodiment. In FIG. 11, the ON resistance characteristics for the comparison example are also depicted. FIG. 11 depicts the results of verification of ON resistance characteristics for the Example and the comparison example; and is a characteristics diagram of one example of the ON resistance characteristics of the comparison example and the Example of the semiconductor device according to the first embodiment. In FIG. 11, the vertical axis represents the ON resistance (unit: $m\Omega cm^2$) and the horizontal axis represents the p-type base region width 102 (unit: μm). As depicted in FIG. 11, verification results confirm that, for example, although the ON resistance increases when the p-type base region width 102 is increased, the ON resistance of the Example only increases about 2% from the ON resistance of the comparison example, even when the p-type base region width 102=3 μm. In FIG. 11, a plot for a case where the p-type base region width 102=1 μm is set is for the comparison example and plots for cases other than the case where the p-type base region width 102=1 μm is set are for the Example.

From the verification results, by setting the p-type base region width 102 to be wider than the trench width 103, increases of the ON resistance may be suppressed and the electric field applied to the gate insulating film 9 may be suppressed.

In the first embodiment, although a case where the second n-type region 5b is formed by ion implantation is shown, the second n-type silicon carbide epitaxial layer 2b may be formed as the second n-type region 5b. In other words, the impurity concentration of nitrogen at the time of epitaxial growth of the second n-type silicon carbide epitaxial layer 2b may be set so as to be the impurity concentration of the second n-type region 5b and the ion implantation may be omitted from the method of manufacture. Further, the $n^+$-type silicon carbide substrate 1 and the n-type silicon carbide epitaxial layer 2 may be collectively the silicon carbide semiconductor base; and in the surface layer of the base first main surface side of the n-type silicon carbide epitaxial layer 2, the p-type base layer 6 may be formed by ion implantation. Further, the $n^+$-type silicon carbide substrate 1 alone may be the silicon carbide semiconductor base, and in the surface layer of the first main surface side of the n⁺-type silicon carbide substrate 1, all of the regions (including the n-type high-concentration region 5, and the first and second p-type base regions 3, 4) constituting the MOS gate structure may be formed by ion implantation.

As described, according to the first embodiment, the first p⁺-type base region that contacts the p-type base layer is provided, whereby the pn junction between the first p⁺-type base region and the n-type drift layer may be formed between adjacent trenches, at a position closer to the drain side than the bottom of the trench. Further, in the n-type drift layer, the second p⁺-type base region is provided so as to surround the trench bottom or so as to be deeper than the trench bottom and face the trench in the depth direction, whereby at a position near the bottom of the trench, the pn junction of the second p⁺-type base region and the n-type drift layer may be formed. In this manner, the pn junction between the n-type drift layer and the first and second p-type base regions is formed, whereby the application of high electric field on the gate insulating film of the trench bottom may be prevented. Therefore, even in a case where a wide bandgap semiconductor material is used as the semiconductor material, high breakdown voltage becomes possible. Further, the second p⁺-type base region having a width that is wider than the trench width is provided, whereby the electric field at the corner portions of the bottom of the trenches may be mitigated and the breakdown voltage may be further increased.

Further, according to the first embodiment, a part of the first p⁺-type base region extends toward the trench side and is connected to the second p⁺-type base region, whereby holes generated when avalanche breakdown occurs at the junction portion of the second p⁺-type base region and the n-type silicon carbide epitaxial layer may be efficiently migrated to the source electrode. Therefore, when the breakdown voltage is in a high state, the ON resistance may be lowered. Further, according to the first embodiment, the width of the second p⁺-type base region is wider than the width of the trench, whereby even when misalignment of the positions of the trench and the second p⁺-type base region occurs along the horizontal direction, the second p⁺-type base region is arranged so as to surround at least one of the corner portions of the trench bottom. As a result, a semiconductor device may be provided, that compared to a conventional semiconductor device, has a higher critical field strength at the gate insulating film and an ON resistance that is maintained to be about the same as in the conventional semiconductor device. Therefore, a high-voltage semiconductor device having a low ON resistance may be manufactured by a method of epitaxial growth and ion implantation or only ion implantation, a method easier than a conventional method.

Figure 12:
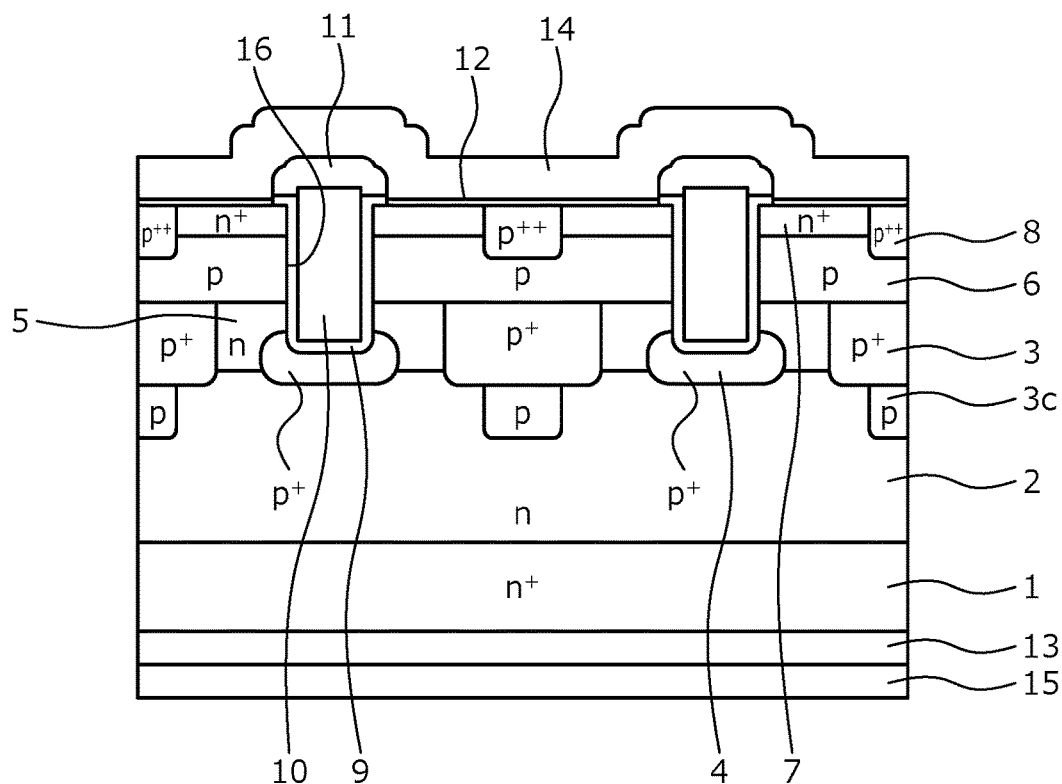
FIG. 12 is a cross-sectional view of a configuration of the silicon carbide semiconductor device according to a second embodiment of the present invention.

FIG. 12 is a cross-sectional view of a configuration of the silicon carbide semiconductor device according to a second embodiment of the present invention. As depicted in FIG. 12, the silicon carbide semiconductor device according to the second embodiment is structured to have in the n-type silicon carbide epitaxial layer 2, a third p-type region 3c provided so as to contact the lower end (end on the drain side) of the first p⁺-type base region 3. The third p-type region 3c functions as a base region together with the p-type base layer 6 and the first p⁺-type base region 3.

A thickness of the third p-type region 3c, for example, may be about 0.1 μm to 0.5 μm. A width of the third p-type region 3c may be narrower than a width of the first p⁺-type base region 3, for example, narrower by 0.1 μm or more than the first p⁺-type base region 3. Further, the third p-type region 3c may be provided so that a thickness thereof is constant continuously along a direction of a side wall of the first p⁺-type base region 3 and along a direction parallel to the surface of the n⁺-type silicon carbide substrate 1, or may be provided in periodic dot-like shapes from a bird's eye view from the n⁺-type silicon carbide substrate 1.

Other configurations of the silicon carbide semiconductor device according to the second embodiment are similar to those of the silicon carbide semiconductor device according to the first embodiment and therefore, redundant description is omitted.

Figure 13:
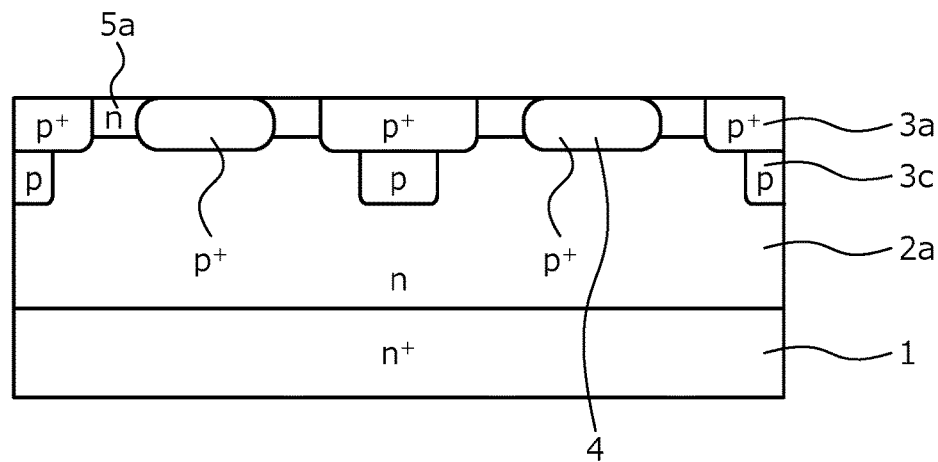
FIG. 13 is a cross-sectional view schematically depicting a state of the silicon carbide semiconductor device according to the second embodiment during manufacture.

FIG. 13 is a cross-sectional view schematically depicting a state of the silicon carbide semiconductor device according to the second embodiment during manufacture. As depicted in FIG. 13, after the formation of the first p-type regions 3a, the second p⁺-type base regions 4, and the first n-type regions 5a, the mask used for the ion implantation is removed. Thereafter, on the surface of the first n-type silicon carbide epitaxial layer 2a, by photolithography, a mask (not depicted) having predetermined openings is formed using, for example, a resist. A p-type impurity, e.g., aluminum atoms, is ion implanted using the resist as a mask. As a result, as depicted in FIG. 13, at a lower part (end on the drain side) of the first p-type region 3a, for example, the third p-type region 3c is formed and a thickness thereof is about 0.25 μm while, for example, a width thereof is about 1 μm. The third p-type region 3c is formed so as to contact the first p-type region 3a. Ion energy when the third p-type region 3c is formed may be set to be, for example, 700 keV so that the dose amount, for example, becomes about 1×10¹⁴/cm².

Other aspects of the method of manufacturing the silicon carbide semiconductor device according to the second embodiment are similar to those of the method of manufacturing the silicon carbide semiconductor device according to the first embodiment and therefore, redundant description is omitted.

FIGS. 14A and 14B are current distribution diagrams for avalanche breakdown in the comparison example and the Example of the silicon carbide semiconductor device according to the second embodiment. In FIGS. 14A and 14B, variation of plane distribution (cross-sectional view) of current values at the time of avalanche breakdown by a structure in which the third p-type region 3c is formed (FIG. 14B) as the Example and a structure in which the third p-type region 3c is not formed as the comparison example (FIG. 14A) is evaluated. As depicted in FIG. 14A, in the comparison example, it is found that avalanche breakdown occurs in the second p⁺-type base region 4 directly beneath the gate electrode 10, and a majority of the current flows directly beneath the gate electrode 10. On the other hand, as depicted in FIG. 14B, in the Example, it was confirmed that avalanche breakdown occurs at the third p-type region 3c and the current path flows from the n⁺ source region 7, through the third p-type region 3c, to the drain side. Similar results are obtained when the thickness of the third p-type region 3c is 0.1 μm or greater and the width is narrower than the first p⁺-type base region 3 by 0.1 μm or more.

As described, according to the second embodiment, similar to the first embodiment, even in a case where a wide bandgap semiconductor is used as a semiconductor material, an effect that high breakdown voltage becomes possible is achieved. Further, according to the second embodiment, at least a part (third p-type region) of the lower end of the first p⁺-type base region is made narrower than the lower end of the second p⁺-type base region, whereby at the time of avalanche breakdown, current flows from the source region, through the third p-type region, to the drain side. Therefore, the electric field at the gate insulating film at the bottom of the trench may be further mitigated.

In the present invention, while a structure in which a first main surface of a silicon carbide substrate containing silicon carbide is a (0001) plane and a MOS gate structure is provided on the (0001) plane has been described as an example, without limitation hereto, the type of the wide bandgap semiconductor (for example, gallium nitride (GaN), etc.), the plane orientation of the main surface, etc. may be various changed. Further, in the present invention, while in the embodiments, the first conductivity type is assumed as an n-type and the second conductivity type is assumed as a p-type, the present invention is similarly implemented when the first conductivity type is a p-type and the second conductivity type is an n-type.

According to the present invention, the ON resistance may be lower when the breakdown voltage is high. As a result, the electric field strength at the gate insulating film at the bottom of the trench is mitigated, enabling the breakdown voltage of the active region to be suppressed and facilitation of the breakdown voltage design of the edge termination region.

The semiconductor device and the method of manufacturing a semiconductor device according to the present invention achieve an effect in that formation is facilitated, the electric field strength at the gate insulating film at the bottom of the trench is mitigated, and the breakdown voltage of the active region is suppressed to thereby facilitate breakdown voltage design of the edge termination structure.

As described, the semiconductor device according to the present invention is useful for high-voltage semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
   a first process including forming a first wide bandgap semiconductor layer of a first conductivity type on a front surface of a wide bandgap semiconductor substrate of the first conductivity type containing a semiconductor material having a bandgap that is wider than a bandgap of silicon, an impurity concentration of the first wide bandgap semiconductor layer of the first conductivity type being lower than an impurity concentration of the wide bandgap semiconductor substrate;
   a second process including selectively forming a first semiconductor region of a second conductivity type and a second semiconductor region of the second conductivity type in a surface layer of the first wide bandgap semiconductor layer of the first conductivity type;
   a third process including forming a second wide bandgap semiconductor layer of the first conductivity type in a surface of the first wide bandgap semiconductor layer of the first conductivity type, the second wide bandgap semiconductor layer of the first conductivity type containing a semiconductor material having a bandgap that is wider than the bandgap of silicon, an impurity concentration of the second wide bandgap semiconductor layer of the first conductivity type being lower than the impurity concentration of the wide bandgap semiconductor substrate;
   a fourth process including selectively forming a third semiconductor region of the second conductivity type in a surface of the second wide bandgap semiconductor layer of the first conductivity type, the third semiconductor region of the second conductivity type in contact with the first semiconductor region;
   a fifth process including forming a wide bandgap semiconductor layer of the second conductivity type on the surface of the second wide bandgap semiconductor layer of the first conductivity type, the wide bandgap semiconductor layer of the second conductivity type containing a semiconductor material having a bandgap wider than the bandgap of silicon;
   a sixth process including selectively forming a source region of the first conductivity type in the wide bandgap semiconductor layer of the second conductivity type;
   a seventh process including forming a trench that penetrates the source region and the wide bandgap semiconductor layer of the second conductivity type and reaches the second wide bandgap semiconductor layer of the first conductivity type to entirely face the second semiconductor region in a depth direction;
   an eighth process including forming a gate electrode in the trench via a gate insulating film;
   a ninth process including forming a source electrode to be in contact with the wide bandgap semiconductor layer of the second conductivity type and the source region; and
   a tenth process including forming a drain electrode on a rear surface of the wide bandgap semiconductor substrate, wherein
   in selectively forming the first semiconductor region of the second conductivity type and the second semiconductor region of the second conductivity type, a part of the first semiconductor region and the second semiconductor region are connected so that the first wide bandgap semiconductor layer of the first conductivity type between the first semiconductor region and the second semiconductor region remains.

2. The method according to claim 1, wherein;
the third semiconductor region is formed to be in contact with a part of a first base region other than a connection part with a second base region.

3. The method according to claim 1, comprising
forming a first region of the first conductivity type after the first process and before the third process, the first region of the first conductivity type being formed between the first semiconductor region and the second semiconductor region in the surface layer of the first wide bandgap semiconductor layer of the first conductivity type.

4. The method according to claim 3, comprising
selectively forming a second region of the first conductivity type after the third process and before the fifth process, the second region of the first conductivity type being formed in a surface layer of the second wide bandgap semiconductor layer of the first conductivity type and being in contact with the first region.

5. The method according to claim 1, comprising
forming a fourth semiconductor region of the second conductivity type after the first process and before the third process, the fourth semiconductor region of the second conductivity type being formed at a position deeper than a position of the first semiconductor region and formed to be in contact with the first semiconductor region.

6. The method according to claim 1, wherein
the first semiconductor region and the second semiconductor region are formed to have a grid-like shape layout from a plan view.

\* \* \* \* \*